US006933538B2

(12) United States Patent
Hunze et al.

(10) Patent No.: US 6,933,538 B2
(45) Date of Patent: Aug. 23, 2005

(54) PLASMA ENCAPSULATION FOR ELECTRONIC AND MICROELECTRONIC COMPONENTS SUCH AS ORGANIC LIGHT EMITTING DIODES

(75) Inventors: Arvid Hunze, Erlangen (DE); Rainer Leuschner, Mohegan Lake, NY (US); Matthias Lipinski, Wappingers Falls, NY (US); Egon Mergenthaler, München (DE); Wolfgang Rogler, Mohrendorf (DE); Georg Wittmann, Herzogenauchrach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/380,145

(22) PCT Filed: Aug. 31, 2001

(86) PCT No.: PCT/DE01/03343

§ 371 (c)(1),
(2), (4) Date: Aug. 26, 2003

(87) PCT Pub. No.: WO02/21610

PCT Pub. Date: Mar. 14, 2002

(65) Prior Publication Data

US 2004/0046165 A1 Mar. 11, 2004

(30) Foreign Application Priority Data

Sep. 11, 2000 (DE) .......................... 100 44 841

(51) Int. Cl.⁷ .......................... H01L 21/48; H01L 29/02
(52) U.S. Cl. .......................... 257/100; 438/26
(58) Field of Search .................... 257/40, 100; 438/99, 438/127, 26

(56) References Cited

U.S. PATENT DOCUMENTS

| | | | |
|---|---|---|---|
| 5,405,808 A | | 4/1995 | Rostoker et al. |
| 5,686,360 A | | 11/1997 | Harvey, III et al. |
| 5,703,394 A | | 12/1997 | Wei et al. |
| 5,747,363 A | | 5/1998 | Wei et al. |
| 5,771,562 A | | 6/1998 | Harvey, III et al. |
| 5,888,591 A | * | 3/1999 | Gleason et al. ............. 427/522 |
| 5,920,080 A | * | 7/1999 | Jones .......................... 257/40 |
| 5,952,778 A | * | 9/1999 | Haskal et al. ............... 313/504 |
| 5,985,378 A | | 11/1999 | Paquet |
| 6,548,912 B1 | * | 4/2003 | Graff et al. ................. 257/787 |
| 6,570,325 B2 | * | 5/2003 | Graff et al. ................. 313/506 |
| 2001/0052752 A1 | * | 12/2001 | Ghosh et al. .............. 313/512 |
| 2002/0003403 A1 | * | 1/2002 | Ghosh et al. .............. 313/512 |

FOREIGN PATENT DOCUMENTS

| | | |
|---|---|---|
| JP | 08-111286 | 4/1996 |
| WO | 97/46052 | 12/1997 |
| WO | 98/27136 | 6/1998 |
| WO | 98/47189 | 10/1998 |
| WO | 98/59356 | 12/1998 |
| WO | 99/02277 | 1/1999 |
| WO | 00/08899 | 2/2000 |
| WO | 00/36661 | 6/2000 |

OTHER PUBLICATIONS

Forrrest et al., "The Dawn of Organic Electronics", Aug. 2000, IEEE Spectrum, pp. 29–34.*
T. Lauinger et al., "UV Stability of Highest–Quality Plasma Silicon Nitride Passivation of Silicon Solar Cells", IEEE, 25th PVSC, May 1996, pp. 417–420.*
Wolf, Silicon Processing for the VLSI Era: vol. 2: Process Integration, Lattice Press, 1990, pp. 274 and 337.*
Patent Abstracts of Japan, Publication No. 01149965, Jun. 13, 1989, "Plasma Reactor,", Hitachi LTD.
Patent Abstracts of Japan, Publication No. 02243502, Sep. 27, 1990, "Protecting Film for Oxide Superconductor and Formation Thereof", Hatsuden, et al.
Patent Abstracts of Japan, Publication No. 05101886, Apr. 23, 1993, "Protection of Electroluminescent Element", TDK Corp.
Patent Abstracts of Japan, Publication No. 08111286, Apr. 30, 1996, "Manufacture of Organic Electroluminescent Element", TDK Corp.
Patent Abstracts of Japan, Publication No. 2000223264, Aug. 11, 2000, "Organic Electroluminescent Element and Manufacture Thereof", Pioneer Electronic Corp.
"Deposition and Properties of Carbon–Based Amorphous Protective Coatings", Klages, et al., Surface and Coatings Technology, vol. 80 (1996) pp. 121–128.
"Electromagnetic Simulation of Passive ICS", Milsom, Phillips Journal of Research, vol. 51, No. 3 (1998) pp. 449–468.
"Passivation for YBCO–Devices using Polymerised Hexamethyldisilazane", Mex, et al., Institute of Physics Conference, No. 158 (1997) pp. 161–164.
"Reliability and Degradation of Organic Light Emitting Devices", Burrows, et al. Appl. Phys. Lett., vol. 65 (23), (1994), pp. 2922–2924.

* cited by examiner

Primary Examiner—Evan Pert
(74) Attorney, Agent, or Firm—Fish & Richardson P.C.

(57) ABSTRACT

Plasma encapsulation for electronic and microelectronic components such as OLEDs. The invention relates to a plasma encapsulation for electronic and microelectronic components such as OLEDs. However, a conventional standard plasma coating process is not used; instead, an especially gentle plasma coating process which does not cause any damage to sensitive components such as an OLED is used, such as the pulsed method or the "remote" or "after glow method."

29 Claims, 3 Drawing Sheets

PLASMA ENCAPSULATION FOR ELECTRONIC AND MICROELECTRONIC COMPONENTS SUCH AS ORGANIC LIGHT EMITTING DIODES

TECHNICAL FIELD

The invention relates to a plasma encapsulation for electronic and microelectronic components such as OLEDs.

BACKGROUND

Components manufactured with materials that are chemically unstable in the atmosphere must be protected against contact with the atmosphere.

A typical example for semiconductor components that must be protected against contact with the atmosphere are organic light-emitting diodes (OLEDs), which are generally manufactured with materials that are not resistant to environmental conditions. Other examples are superconductive components based on YBCO ("YBCO" stands for yttrium barium copper oxide, which is a superconductive material) thin films (L. Mex et al. in Applied Superconductivity, 1997. Proceedings of EUCAS 1997 Third European Conference on Applied Superconductivity volume 1, pages 161–164) or electronic components on an organic basis, such as organic field effect transistors (OFET).

Incompatibility with the atmosphere places particular demands on the thickness of encapsulation. In addition, materials that are unstable in the atmosphere are often characterized by high reactivity to many other materials. This means that chemical compatibility between the materials used for encapsulation and the component to be protected must be ensured. Moreover, the thermal resistance of the functional organic materials used in OLEDs is limited. Consequently, another requirement for the encapsulation process is that it must be performed at the lowest possible temperatures. This is especially the case with OLEDs, which are generally only resistant up to temperatures of approx. 100° C.

Another important requirement, in addition to thermal compatibility during the production process, is resistance to thermal stress during the use of the display. Consequently, materials of particular interest for encapsulation are those that exhibit a suitable thermal conductivity for heat removal, thereby protecting the device against overheating.

Another requirement for encapsulation is added when OLEDs are to be applied to flexible substrates, such as polymer foils or chip cards. In this case, the encapsulation must also be flexible.

SUMMARY

In principle, thin-layer processes and, in particular, plasma-supported CVB (chemical vapor deposition) processes are suitable for use with such encapsulation processes. It is known that they can be executed in such a way that the temperature requirement (T<100° C.) is fulfilled. Because of the strong intrinsic integration of plasma layers, they possess thermal conductivity, which is used in a targeted manner with DLC (diamond-like carbon) a-C:H coatings for heat removal on components. In addition, plasma processes provide pinhole-free coatings, which are also flexible. Furthermore, plasma-supported processes are widely used in semiconductor technology and are easily automated. Nonetheless, it has not been possible to date to use such processes in the coating of OLEDs. In the professional sphere, it is believed that radiation damage triggered by the photons in the plasma causes damage to the OLEDs (U.S. Pat. No. 5,771,562, Sp. 1, Z. 37/39; U.S. Pat. No. 5,686,360, Sp. 2, Z. 18/20; U.S. Pat. No. 5,747,363, Sp. 2, Z. 14/17).

This is explained by the fact that plasma contains photons whose energy is sufficient to split chemical bonds. When these photons interact with the compounds of the organic light-emitting diodes, a chemical modification of this material takes place. However, because the light-emitting properties of these materials depend very precisely on the chemical structure of the materials used, such modification, which is poorly defined in chemical terms, heavily affects or completely eliminates the light-emitting properties.

Although plasma-polymerized coatings for the coating of OLEDs are proposed in several printed publications, such as WO 98/47189, WO 98/59356 and WO 99/02277, these publications only make reference to conventional plasma-coating techniques, such as those used as standard processes in the semiconductor industry. This means that radiation damage, which is described in the US publications and is, in fact, unavoidable, is accepted and, for the reasons cited above, no OLEDs with technically appealing serviceable lives can be manufactured in the manner proposed therein.

The encapsulation of OLEDs with the aid of "roof structures" made from atmosphere-proof materials is known in the art. Glass is used in most cases. However, it is also known that metals can be used for this purpose. These roof structures are bonded to the substrate onto which the OLED layer systems are applied and cover the entire OLED layer structure. An especially advantageous method of encapsulation is described in DE 19943148.5 (as yet unpublished). It describes the use of so-called glass caps, which contain cavities in the area in which the OLED layer structure is covered. These cavities are easily manufactured to any shape and depth by means of sand blasting, for example. In all cases, special attention is paid to the bonding technology used to bond together the substrate and the roof structure. For example, "glass soldering" is used, i.e., the bonding of glass parts by means of glass soldering (WO 97/46052). As this requires high temperatures, organic adhesives such as epoxies are also used to encapsulate organic diodes. However, absolute hermetic encapsulation cannot be achieved with organic adhesives, creating the risk, particularly at high relative humidity, that the base metals used as cathodes may corrode and/or the light-emitting substances may be adversely affected.

Consequently, plasma thin-layer coating is preferable in all cases. For the following reasons, however, the standardized and known methods for plasma coating and producing pinhole-free barrier coatings are not suitable for the coating of OLEDs.

A plasma is created when charged particles are accelerated to a sufficient extent that the ionization energy of the gas or gas mixture being used is attained. In addition to ions and electrons, this produces photons and excited species, all of which interact with the component being coated. As a result of these interactions, the surface of the component is chemically modified, which can already exert an adverse effect on its properties. In addition, the ion bombardment leads to an increase in the temperature of the component, which, in the case of organic light-emitting diodes, can also lead to impairment of the performance of the component following coating. In particular, however, radiation damage triggered by the photons present in the plasma must be viewed as the absolute exclusion criterion for the use of plasma-supported processes in the coating of OLEDs.

This is all the more applicable since, in order to achieve hermetically sealed coatings, the coating process must be performed at relatively high plasma output levels and high self-bias (=large amount of ion energy) (cf. Klages et al., Surface and Coatings Technology, Elsevier: 1996, volume 90, Nos. 1–2, pages 121–128). Under these conditions, the effects of the plasma on the OLED are especially disadvantageous.

The objective of the invention, therefore, is to provide a process for the coating of an electronic or microelectronic component by means of thin-layer coating, especially by means of plasma coating, in which no significant radiation damage to the component is caused. It is also the objective of the invention to provide an OLED with a thin-layer encapsulation by means of plasma coating.

Thus, the object of the invention is a component comprising a substrate, an organic light-emitting diode disposed on the substrate and an encapsulation, wherein the encapsulation is produced in accordance with a thin-layer process. In addition, the object of the invention is a process for encapsulating an electronic or microelectronic component by means of plasma coating, in which the reactivity of plasma-excited particles in the decay phase is utilized. The object of the invention is a process in which the plasma source is operated in a pulsed manner. In addition, the object of the invention is a process for encapsulating an electronic or microelectronic component by means of a "remote" or "after glow" process, in which plasma and the component to be coated are spatially separated from one another, thereby minimizing the interaction of the component with the accelerated ions and photons.

DESCRIPTION OF DRAWINGS

Like reference symbols in the various drawings indicate like elements.

DETAILED DESCRIPTION

In both versions of the process, the critical requirement in its execution is to minimize the effects of the plasma on the component. There is a lower limit, or minimum output level for ignition of a plasma. However, the effectively utilized output for coating the component at this minimum value can be further reduced by operating the plasma in a pulsed manner, or by placing the sample to be coated in the remote zone of the plasma.

For this reason, pulsed operation is also especially advantageous, because the decay phase of excitation is effective in terms of deposition. It takes place where or when the plasma is no longer being excited. A "spatial" dark phase is found in remote areas of the plasma disposed at a great distance from the plasma source. A "temporal" "dark" phase exists between the pulses, i.e., the downtimes for the excited output, as the serviceable lives of the light-emitting particles are brief.

A "spatial" dark phase is found in remote areas of the plasma disposed at a great distance from the plasma source. A "temporal" "dark" phase is found between the pulses, i.e., the downtimes for the excited output, as the serviceable lives of the light-emitting particles are brief.

Figure 1:
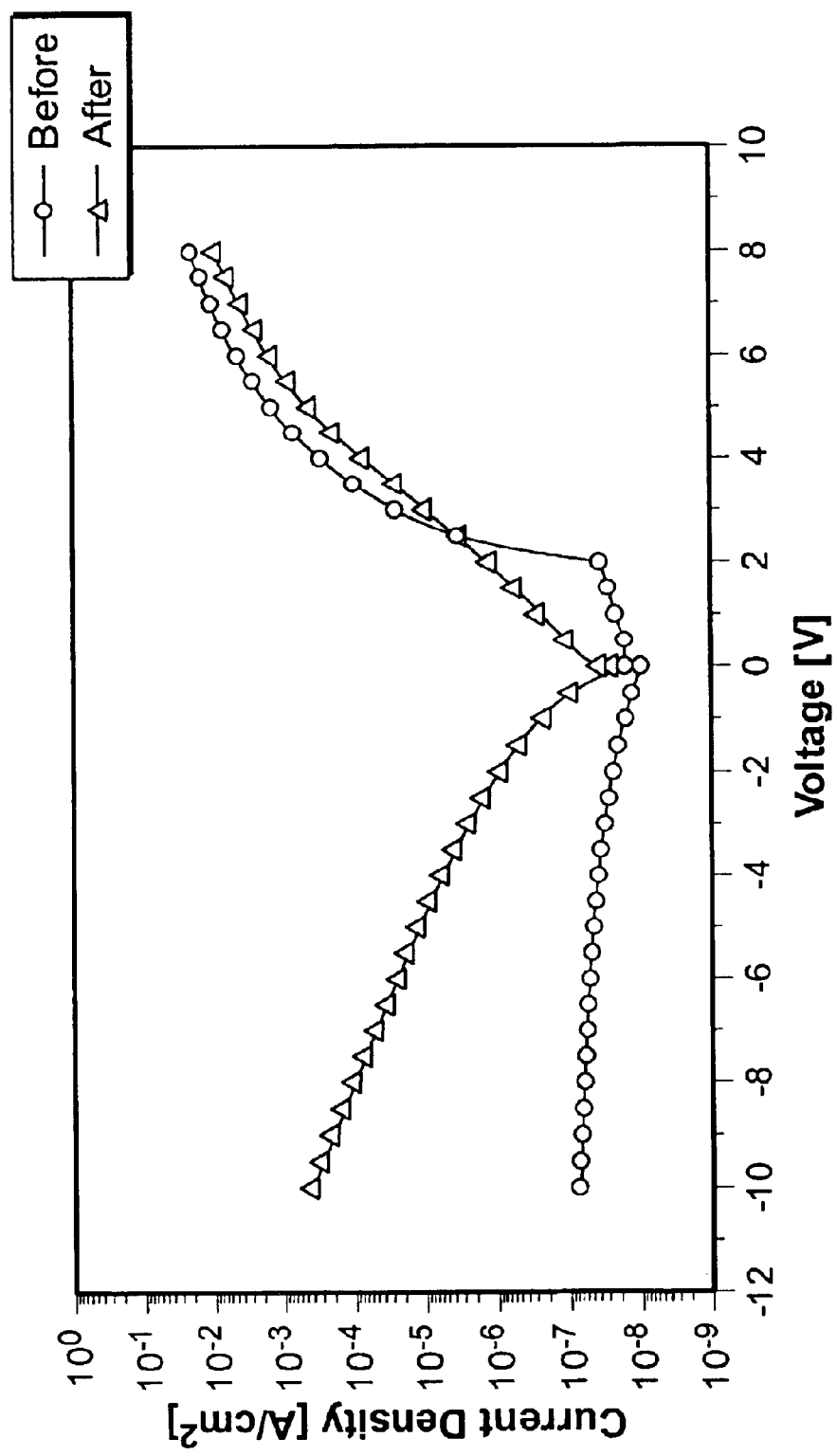
FIG. 1 shows OLED characteristic curves with insufficient blocking characteristics.
Figure 2:
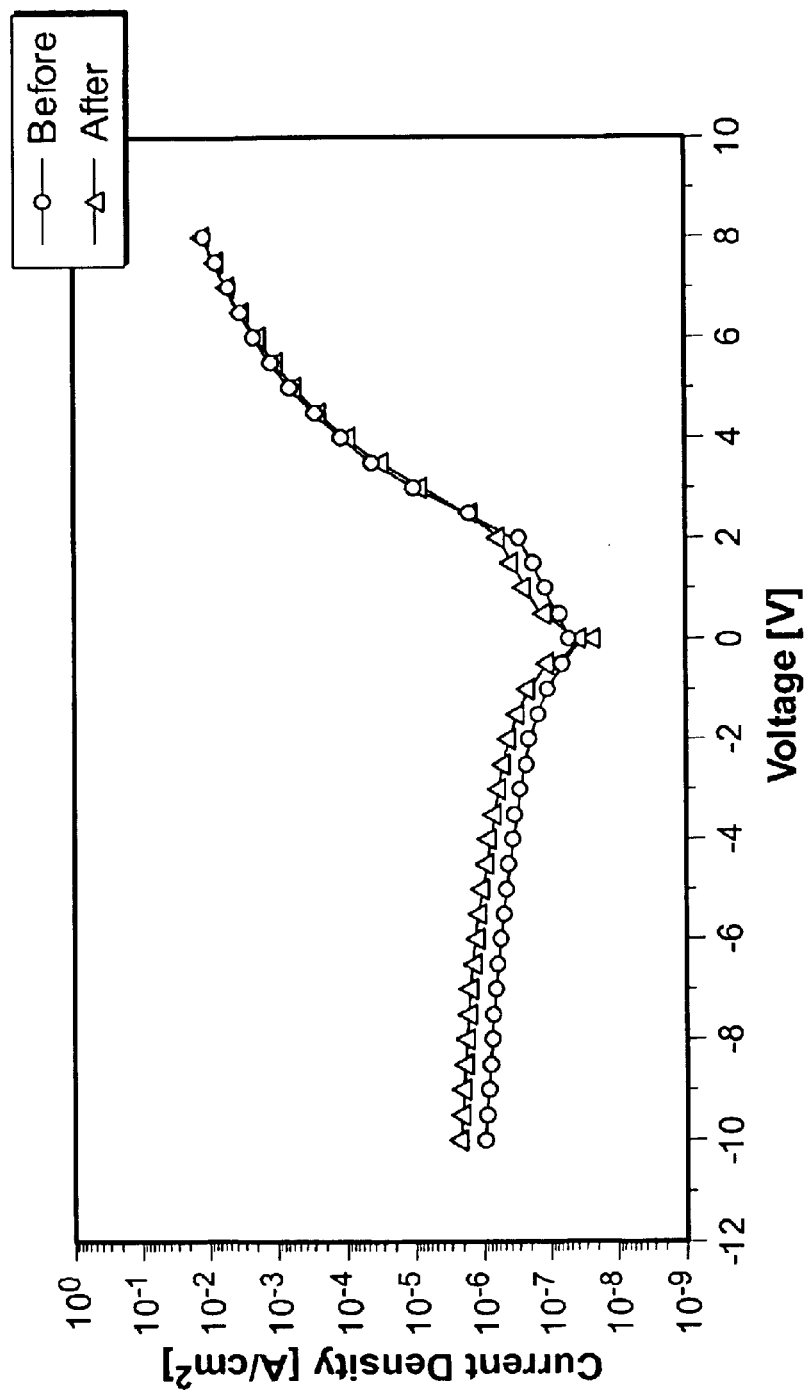
FIG. 2 shows OLED characteristic curves with a blocking ratio at ±8 V.
Figure 3:
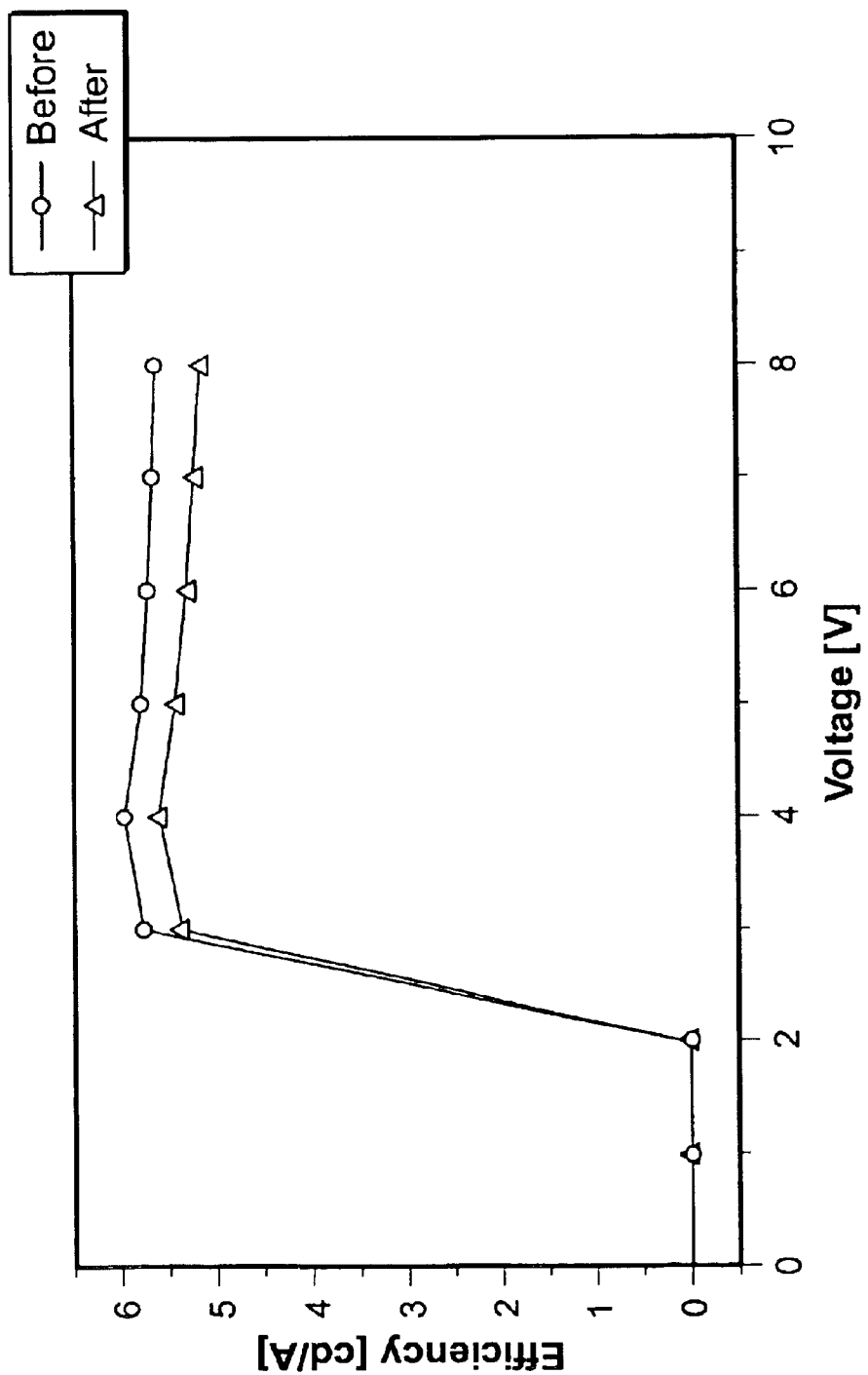
FIG. 3 shows OLED characteristic curves with a constant efficiency across a voltage range of up to 10 V.

As a result of the use of pulsed ECR (electron cylotron resonance) plasma, sensitive components in the electronics and/or microelectronics survive a thin-layer coating without damage and with virtually unchanged characteristic curves (see FIGS. 1 to 3).

The plasma output to be set for coating purposes must be just above the minimum output required to ignite the plasma. The period in which the plasma is activated is preferably about 20% of the entire duration of coating. Such coating processes have no measurable effect on the characteristic curves of an OLED, even at a duration of one hour.

Organic monomers whose boiling point at a pressure of 1 bar is not higher than 300° C. are preferably used as precursors for plasma deposition. In principle, preference should be given to simple hydrocarbons, such as ethylene or methane, as they are inexpensive and gaseous. In addition, the hydrogen has a reducing effect, which is beneficial to the base cathode metals. The precursor for the remote or after glow processes is limited in comparison to coating in the pulsed, low-energy plasma Economically feasible deposition rates can only be achieved with comparatively reactive precursors. Elevated reactivity, in this sense, is generally present when the precursor has at least one unsaturated bond.

Another critical issue in the execution of thin-layer encapsulation is adhesion, both between the OLED structure and the plasma coating and between the plasma coating and the subsequent barrier. If the plasma coating does not reliably adhere to the OLED, the coating can warp and cracks can develop. As a result, the subsequently applied metal coating can come into electrical contact with the OLED cathode, rendering the OLED unusable. To secure adhesion to the adjacent coatings, and depending on the type of adjacent coating, it may be necessary to include functional groups in the plasma coating that interact with the adjacent coating. In this case, the use of pure hydrocarbons is no longer productive; instead, heteroatoms must be present in the plasma coating. On the one hand, this can be achieved by using a precursor that contains heteroatoms. However, the use of precursor mixtures is also possible. Preferably, at least one additional precursor is added to a pure hydrocarbon and serves as the heteroatom source. This procedure is advantageous when different adjacent coatings surround the plasma coating, as the type of heteroatom source can then be selected in such a way as to ensure optimal adhesion to each adjacent coating. In this case, the heteroatom precursor is only added to the plasma during the coating process phase in which the boundary coating is produced. Nitrogenous (amines, pyrroles) and sulfurous (SF6 and thiophene) precursors have proven to be advantageous.

The plasma coatings obtained by the method of the invention are, in principle, only slightly integrated and thus are not hermetically sealed against the atmosphere. However, they are pinhole-free, thermally conductive, and electrically insulating. This makes it possible to use vapor-deposited metal coatings as hermetically tight barriers.

If, in accordance with the present invention, the first coating is selected to be sufficiently thick, an addition coating can be applied by means of conventional plasma processes in continuous, i.e., non-pulsed mode without adversely affecting the OLED. This is the case when the first coating protects the component to be coated against the effect of the plasma and the temperature can, for example, be kept below 100° C. with components that are only stable at temperatures below 100° C.

If additional mechanical protection of the component such as that achieved with the "roof structure" (cf. DE 19943148.5) is desired, the encapsulation technology of the invention can be combined with such a structure.

The terms "remote" plasma and "after glow," which refer to the same thing, are known to the average person skilled in the art involved in the respective field.

For execution purposes, commercially obtainable HDP sources (high density plasma sources) can be used, for example, if the acceleration voltage directed to the substrate is switched off (bias power=0) and the distance between the substrate and the plasma source is sufficiently large. A minimum distance of half the length of the plasma zone appears to be advisable in this context.

The preferred distance between the plasma source and the substrate to be coated ranges between 20 and 70 cm, preferably between 30 and 50 cm, with approx. 40 cm being especially preferable.

FIG. 1 shows an OLED characteristic curve with an insufficient blocking characteristic, which is attributable to plasma damage, as indicated in the literature and cited in the text. The terms "before" and "after" refer to the deposition of the plasma barrier coating.

FIG. 2 shows an OLED characteristic curve with a blocking ratio at ±8 V suitable for application. The difference between this characteristic and that depicted in FIG. 1 lies in the choice of the plasma parameters. This characteristic demonstrates that damage to the OLED coating by the plasma can be avoided through suitable process control.

FIG. 3 shows characteristic curves exhibiting constant efficiency across a voltage range of up to 10 V. This efficiency is insignificantly reduced by covering the OLED with the barrier plasma coating ("after").

What is claimed is:

1. A component comprising:
    a substrate,
    an organic light-emitting diode disposed on the substrate, and
    an encapsulation of the organic light emitting diode, wherein the encapsulation includes a first coating and a second coating, wherein the second coating comprises a vapor deposited metal coating, and wherein the first coating is closer to the organic light-emitting diode than the second coating.

2. The component of claim 1, further comprising an additional coating produced by means of a conventional plasma process.

3. The component of claim 1, further comprising a roof structure.

4. A process for encapsulating an electronic or microelectronic component, comprising:
    operating a plasma source in a pulsed manner to generate plasma; and
    depositing a coating from the generated plasma to encapsulate an organic light-emitting diode.

5. The process of claim 4, wherein depositing comprises:
    adding at least one hydrocarbon precursor for plasma deposition.

6. The process of claim 5, wherein the at least one hydrocarbon precursor is one of ethylene and methane.

7. The process of claim 4, wherein depositing comprises:
    adding at least one precursor that has at least one unsaturated bond for plasma deposition.

8. The process of claim 4, wherein depositing comprises:
    adding at least one precursor that features at least one functional group that interacts with an adjacent coating.

9. The process of claim 4, wherein depositing comprises:
    adding at least one precursor that has at least one heteroatom for plasma deposition.

10. The process of claim 9, wherein the at least one heteroatom is one of a nitrogen and a sulfur atom.

11. The process of claims 4, further comprising:
    forming one or more of a vapor-deposited metal coating, a conventional plasma coating and a roof structure.

12. The process of claim 4, wherein operating the plasma source in a pulsed manner comprises:
    pulsing the plasma source so that plasma is activated during approximately 20% of the entire duration of the encapsulation process.

13. The process of claim 4, wherein depositing comprises:
    adding at least one organic monomer precursor for plasma deposition.

14. The process of claim 13, wherein the organic monomer has a boiling point at a pressure of 1 bar that is not higher than 300° C.

15. The process of claim 13, wherein the at least one organic monomer precursor is selected from the group consisting of: amines, pyroles, sulfur fluorides and thiophenes.

16. A process for encapsulating an electronic or microelectronic component, comprising:
    depositing a coating from plasma on an organic light-emitting diode, wherein the plasma is generated by means of an after glow process in which the plasma and the electronic or microelectronic component to be coated are spatially separated from one another.

17. The process of claim 16, wherein the spatial distance between the plasma source and the component to be coated is approximately 40 cm.

18. The process of claim 16, further comprising
    pulsing the plasma source so that plasma is activated during approximately 20% of the entire duration of the encapsulation process.

19. The process of claim 16, wherein depositing comprises:
    adding at least one organic monomer precursor for plasma deposition.

20. The process of claim 19, wherein the organic monomer has a boiling point at a pressure of 1 bar that is not higher than 300° C.

21. The process of claim 19, wherein the at least one organic monomer precursor is selected from the group consisting of: amines, pyroles, sulfur fluorides and thiophenes.

22. The process of claim 16, wherein depositing comprises:
    adding at least one hydrocarbon precursor for plasma deposition.

23. The process of claim 22, wherein the at least one hydrocarbon precursor is one of ethylene and methane.

24. The process of claim 16, wherein depositing comprises:
    adding at least one precursor that has at least one unsaturated bond for plasma deposition.

25. The process of claim 16, wherein depositing comprises:
    adding at least one precursor that features at least one functional group that interacts with an adjacent coating for plasma deposition.

26. The process of claim 16, wherein depositing comprises:
    adding at least one precursor that has at least one heteroatom for plasma deposition.

27. The process of claim 16, wherein the at least one heteroatom is one of a nitrogen and a sulfur atom.

28. The process of claims 16, further comprising:
forming one or more of a vapor-deposited metal coating, a conventional plasma coating and a roof structure.

29. A component comprising:
a substrate,
an organic light-emitting diode disposed on the substrate, and
a first coating that encapsulates the organic light emitting diode to substantially protect the organic light emitting diode against contact with a surrounding atmosphere and a second coating which comprises a vapor-deposited metal coating, wherein the first coating is closer to the organic light-emitting diode than the second coating.

* * * * *